United States Patent
Pio et al.

[11] Patent Number: 6,151,245
[45] Date of Patent: Nov. 21, 2000

[54] SCREENED EEPROM CELL

[75] Inventors: Federico Pio, Brugherio; Nicola Zatelli, Bergamo, both of Italy; Laurent Sourgen; Mathieu Lisart, both of Aix en Provence, France

[73] Assignees: STMicroelectronics, S.r.l., Agrate Brianza, Italy; STMicroelectronics, S.A., Gentilly, France

[21] Appl. No.: 09/215,650

[22] Filed: Dec. 17, 1998

[30] Foreign Application Priority Data

Dec. 18, 1997 [FR] France .................................. 97 16433

[51] Int. Cl.$^7$ ...................................................... G11C 16/04
[52] U.S. Cl. ...................................... 365/185.05; 257/316
[58] Field of Search ......................... 365/185.05, 185.26, 365/185.33; 257/314, 316

[56] References Cited

U.S. PATENT DOCUMENTS

| | | | |
|---|---|---|---|
| 5,504,706 | 4/1996 | D'Arrigo et al. | 365/185.33 |
| 5,557,569 | 9/1996 | Smayling et al. | 365/185.33 |
| 5,751,038 | 5/1998 | Mukherjee | 257/316 |
| 5,852,290 | 12/1998 | Chaney | 235/492 |
| 5,895,949 | 4/1999 | Endoh | 257/314 |

FOREIGN PATENT DOCUMENTS

| | | |
|---|---|---|
| 0 169 941 | 2/1986 | European Pat. Off. . |
| 0 172 108 | 2/1986 | European Pat. Off. . |
| 2 471 051 | 6/1981 | France . |

*Primary Examiner*—Trong Phan
*Attorney, Agent, or Firm*—Theodore E. Galanthay, Esq.; Robert Iannucci, Esq.; Seed IP Law Group, PLLC

[57] ABSTRACT

An EEPROM cell is described as having a screening metal structure formed of preference in the first metal layer and located in substantial overlaying relationship at the floating gate terminal. This defeats the possibility of anomalous readings being obtained by measuring the amount of charge on the floating gate terminal. An additional screening metal structure, to be formed in the third and following metal layers, may be provided to fully overlie the cell and provide additional protection against anomalous readings.

16 Claims, 3 Drawing Sheets

SCREENED EEPROM CELL

TECHNICAL FIELD

This invention relates to a memory cell of the EEPROM type.

BACKGROUND OF THE INVENTION

The circuit and construction of an EEPROM cell is known, for example, from U.S. Pat. No. 5,107,461, and a process for manufacturing such cells is known from U.S. Pat. No. 5,132,239, both documents being incorporated hereto by reference.

A typical field of application for EEPROMs is that of chip cards, better known as smart cards.

In such applications, it is highly important to prevent the data contained in the memory from being read in an anomalous way, that is by unsealing the package and reading directly from the die through the terminals of the cell matrix, rather than through the terminals of the memory device.

It is common practice, in manufacturing the integrated circuit, to cover the memory device, and hence the matrix, with a metal structure. Accordingly, a direct reading can only be effected by first removing this metal structure, which represents a difficult and critical operation susceptible to result in the memory contents being destroyed.

SUMMARY OF THE INVENTION

An embodiment of this invention provides a memory with improved protection against anomalous readings.

The embodiment includes a memory cell of the EEPROM type having a floating gate terminal of the cell substantially overlaid by a screening metal structure.

According to another aspect of the invention, a memory device and a smart card are also provided wherein a cell so constructed can be used to advantage.

DETAILED DESCRIPTION OF THE INVENTION

Figure 1:
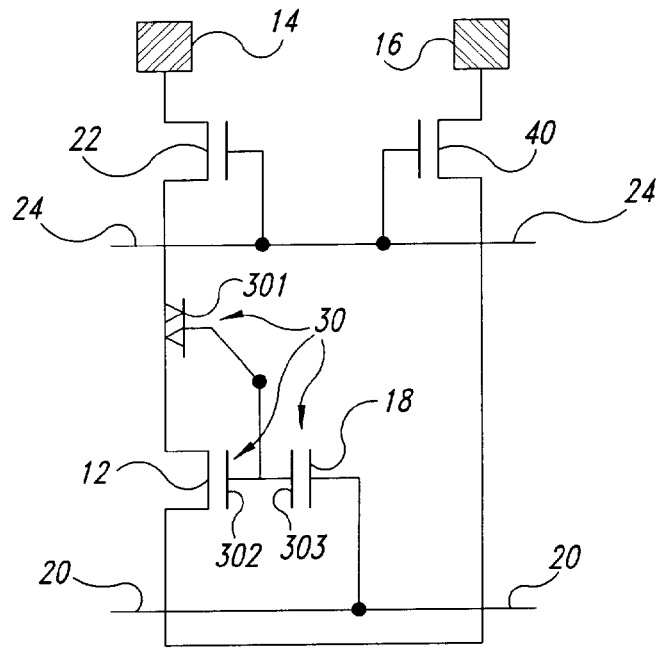
FIG. 1 shows a circuit diagram of an EEPROM cell according to the prior art.

Referring to FIG. 1, an EEPROM cell according to the prior art comprises a memory element consisting of a tunnel element 10, a transistor 12, and a capacitor 18. A terminal 301 of the element 10, the control terminal 302 of the transistor 12, and a terminal 303 of the capacitor 18 are all connected together to form the floating gate terminal 30 of the cell. The element 10 is the circuit component that allows charges to be injected into and extracted from the floating gate terminal 30 of the cell.

The other terminal of the element 10 and the main (drain-source) conduction path of the transistor 12 are connected in series between a bit line 14 and a common line 16. A primary selection transistor 22 is connected between the line 14 and the element 10, and an auxiliary selection transistor 40 is connected between the source terminal of the transistor 12 and the line 16. By measuring the current flowing through the lines 14 and 16, the charged condition of the floating gate terminal 30 of the cell can be determined, and accordingly, these lines can be regarded as the read terminals of the cells.

The control terminals of the transistors 22 and 40 are connected together and to a word line 24 forming the selection terminal 24 of the cell.

The other terminal of the capacitor 18 is connected to a local line 20 forming the control terminal 20 of the cell.

Figure 2:
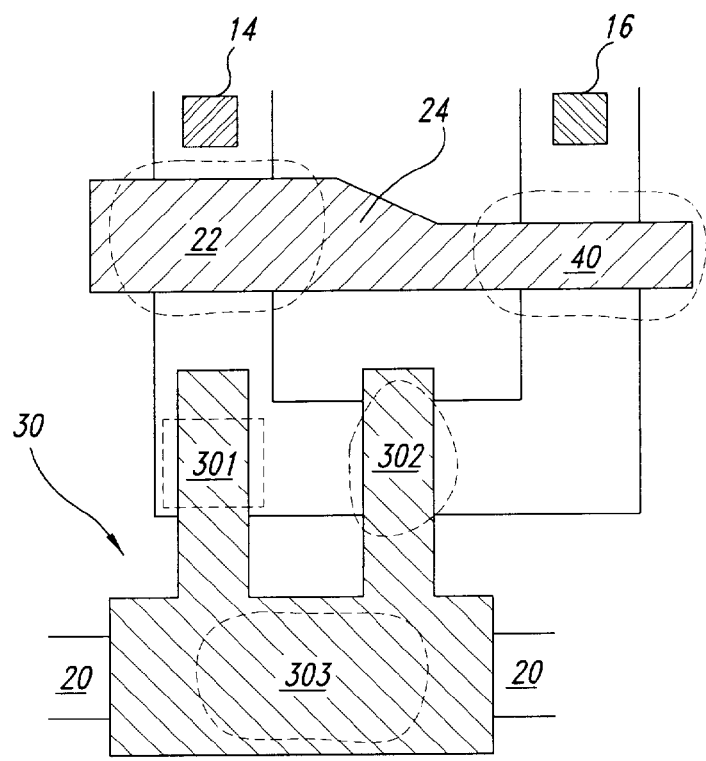
FIG. 2 shows a layout of the memory cell in FIG. 1, incorporating no metal layers.

Depicted in FIG. 2 is a conventional layout (having no metal layers) of the cell shown in FIG. 1, wherein corresponding elements are denoted by the same references as in FIG. 1. The line 24 and terminal 30 are formed in a polysilicon layer overlying an oxide layer; the thickness of this oxide is provided considerably small, so as to trigger the tunnel effect.

Figure 3:
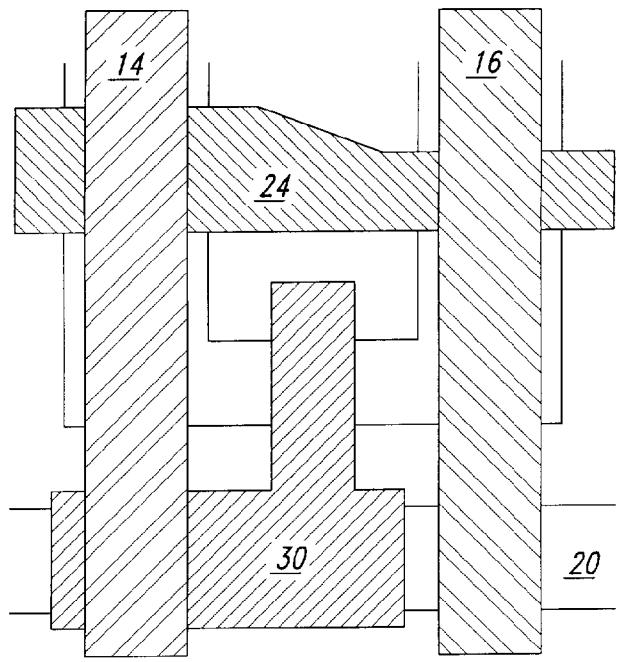
FIG. 3 shows a layout of the memory cell in FIG. 1 which incorporates metal layers.

FIG. 3 shows the same layout as FIG. 2, but with metal layers included. In particular, the lines 14 and 16 are formed in a first metal layer METAL1.

Today's fabrication technology of integrated circuits can provide processes with a large number of metal layers, e.g., 4 or 5. Of course, the larger the number of layers, the greater becomes the process complexity and cost. It is customary to reference the layers as METAL1, METAL2, METAL3, etc., proceeding from the layer closest to the substrate toward the farthest layer from the substrate.

Figure 4:
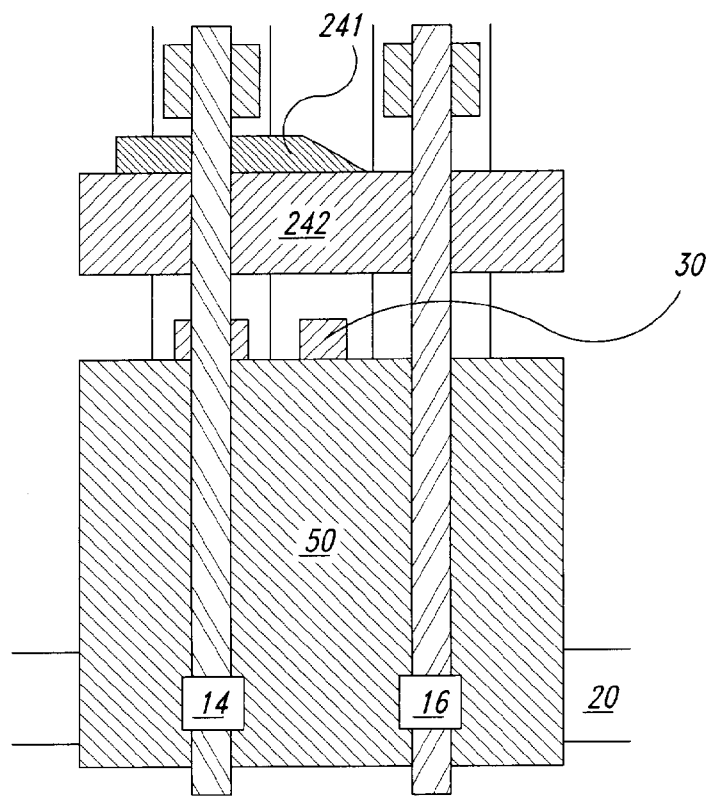
FIG. 4 shows a layout of a memory cell incorporating metal layers in accordance with this invention.

FIG. 4 shows a layout (incorporating metal layers) of a memory cell according to the invention, which reflects the layouts of FIGS. 2, 3, for the cell of FIG. 1 as modified in conformity with the teachings of this invention.

In a memory cell according to the invention, a screening metal structure 50 is arranged to overlie the floating gate terminal 30. Preferably, the structure 50 will fully cover the terminal 30 only.

Advantageously, the screening metal structure 50 is formed in the first metal layer METAL1.

To reduce the resistivity of the word line 24, the selection terminal is provided by a polysilicon structure 241 contacting a metal structure 242 formed in the first metal layer METAL1 in overlapped relationship.

To obtain a compact cell layout, one or each read terminal 14, 16 may advantageously be provided by a metal structure formed in a metal layer following the first, specifically the second metal layer METAL2.

For an anomalous reading from a memory device having a cell matrix as described above to be effected, it would be necessary to remove everything from above the first metal layer METAL1. However, such an operation would eliminate the main connections (bit lines 14 and common lines 16) of the cell matrix, and then the anomalous reading could no longer be made by direct reading at the matrix terminals but only by directly measuring the amount of charge existing on the floating gate terminals 30 of the individual cells, which operation is made impracticable by the metal screen 50. Moreover, this screen 50 prevents the memory cell from being erased and programmed by radiation, e.g., UV radiation. Should the screen 50 be taken away by removing the metal layer METAL1, there remains to be made the direct measurement of the charge on the terminals 30, an operation at once difficult and critical to perform. In addition, since the polysilicon layer that provides the terminals 30 locates very near the layer METAL1, an alteration of its charged state during the removal is most likely to occur.

In an alternative embodiment a metal structure is formed in the third or following metal layers METAL3, METAL4, etc. to overlie the whole cell, thereby providing additional protection.

The screening metal structure 50 may be connected electrically to a fixed reference of potential, preferably to ground. In this way, it would become impossible to measure the amount of charge on the terminal 30, even when using a potential-sensing electron microscope, because the structure 50 also functions as an electrostatic screen.

Alternatively, the screening metal structure 50 could be connected electrically to the control terminal 20. This would increase the capacitive coupling between the control terminal and the floating gate terminal of the cell, and assist in the programming and erasing operations.

Figure 5:
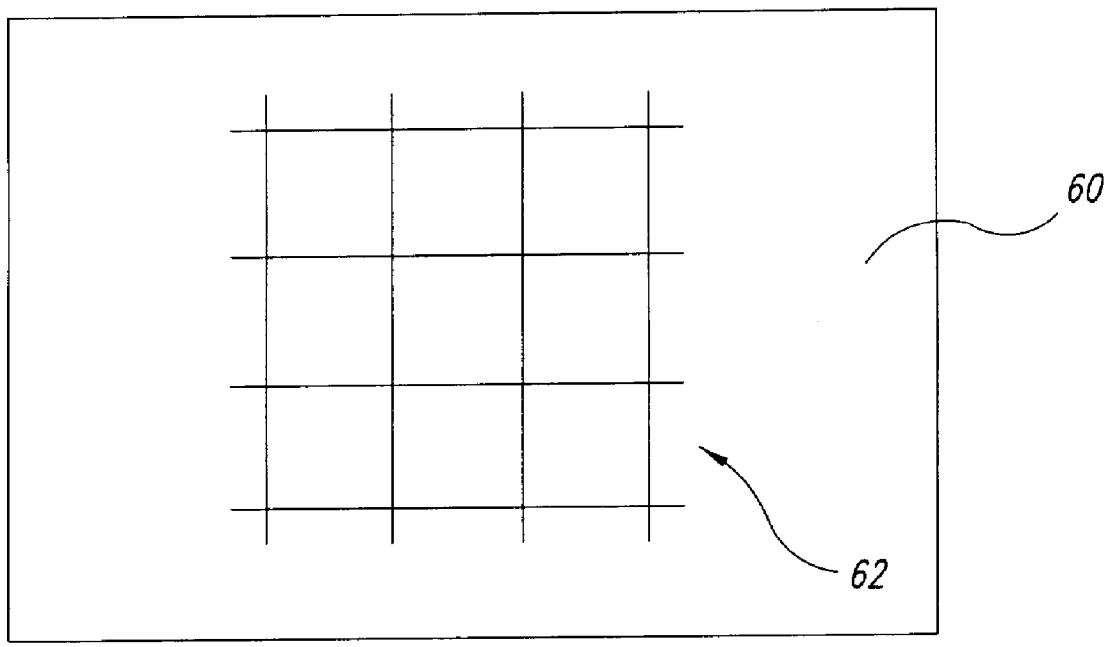
FIG. 5 shows a smart card with an EEPROM memory matrix of memory cells according to FIG. 4.

It will be appreciated that such a cell may be used to advantage as a basic element for an EEPROM matrix, within memory devices, including smart cards. A smart card 60 including an EEPROM matrix 62 of memory cells of FIG. 4 is shown in FIG. 5. Each intersection of the horizontal and vertical lines represents a memory cell. Of course, other circuits may be on smart card 60, but these are not shown for simplicity.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An EEPROM memory cell, comprising:
   a floating gate transistor formed on a semiconductor substrate with a floating gate terminal;
   a first selection transistor coupled to the floating gate transistor and having a polysilicon selection terminal;
   a first metal layer positioned above the semiconductor substrate; and
   a second metal layer positioned further from the substrate than the first metal layer, wherein the first metal layer includes a screening first metal structure arranged to substantially overlie the floating gate terminal and wherein the first metal layer further includes a second metal structure that directly contacts the selection terminal in an overlapped relationship.

2. A cell according to claim 1, further comprising a second selection transistor coupled to the floating gate transistor and having a control terminal directly connected to the selection terminal.

3. A cell according to claim 1, further comprising a read terminal formed by a metal structure formed in the second metal layer.

4. A cell according to claim 3, wherein a metal structure formed in a third or following metal layers is arranged to substantially overlie the whole cell.

5. A cell according to claim 1, wherein said screening first metal structure is connected electrically to a fixed reference potential.

6. A cell according to claim 1, further comprising a control terminal capacitively coupled to the floating gate terminal and connected electrically to said screening metal structure.

7. An EEPROM memory device, comprising an EEPROM matrix formed of cells according to claim 1.

8. A smart card, including an EEPROM matrix according to claim 7.

9. An EEPROM memory cell, comprising:
   a semiconductor substrate;
   a floating gate transistor formed on the semiconductor substrate;
   a first selection transistor coupled to the floating gate transistor and having a polysilicon selection terminal;
   a first metal structure substantially covering the floating gate transistor;
   a second metal structure overlapping the first metal structure; and
   a third metal structure directly contacting the selection terminal in an overlapping relationship.

10. The EEPROM memory cell of claim 9 wherein the second metal structure includes a read terminal for reading the floating gate transistor.

11. The EEPROM memory cell of claim 9 wherein the first and third metal structures are part of a first metal layer.

12. The EEPROM memory cell of claim 9, further comprising a fourth metal structure overlying the entire memory cell except for the fourth metal structure.

13. The EEPROM memory cell of claim 9 wherein the first metal structure is connected electrically to a fixed reference of potential.

14. The EEPROM memory cell of claim 9 wherein the floating gate transistor includes a floating gate and the EEPROM memory cell further comprises a control terminal capacitively coupled to the floating gate and electrically coupled to the first metal structure.

15. An EEPROM memory device, comprising an EEPROM matrix formed of EEPROM memory cells according to claim 9.

16. A smart card, including an EEPROM matrix according to claim 15.

* * * * *

UNITED STATES PATENT AND TRADEMARK OFFICE
CERTIFICATE OF CORRECTION

PATENT NO. : 6,151,245
DATED : November 21, 2000
INVENTOR(S) : Federico Pio et al.

It is certified that error appears in the above-identified patent and that said Letters Patent is hereby corrected as shown below:

Title page,
Item [56], References Cited, insert the following:
-- GB 2308 738A    07/02/97    United Kingdom -- should appear under FOREIGN PATENT DOCUMENTS.

Signed and Sealed this

Twenty-third Day of July, 2002

Attest:

Attesting Officer

JAMES E. ROGAN
Director of the United States Patent and Trademark Office